United States Patent
Wada et al.

(10) Patent No.: US 6,743,974 B2
(45) Date of Patent: Jun. 1, 2004

(54) SILICON SOLAR CELL WITH GERMANIUM BACKSIDE SOLAR CELL

(75) Inventors: Kazumi Wada, Lexington, MA (US); Lionel C. Kimerling, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/140,640

(22) Filed: May 8, 2002

(65) Prior Publication Data

US 2002/0179142 A1 Dec. 5, 2002

Related U.S. Application Data

(60) Provisional application No. 60/289,410, filed on May 8, 2001.

(51) Int. Cl.[7] .................. H01L 31/06; H01L 31/068
(52) U.S. Cl. .................. 136/255; 136/249; 136/261; 257/461; 257/431; 438/74
(58) Field of Search .................. 136/255, 249, 136/261; 257/461, 431; 438/74

(56) References Cited

U.S. PATENT DOCUMENTS

| | | | |
|---|---|---|---|
| 4,171,235 A | 10/1979 | Fraas et al. | |
| 4,255,211 A | * 3/1981 | Fraas | ................. 136/249 |
| 4,377,723 A | * 3/1983 | Dalal | ................. 136/249 |
| 4,492,743 A | 1/1985 | Howe | ................. 429/111 |
| 4,496,788 A | 1/1985 | Hamakawa et al. | |
| 4,598,164 A | * 7/1986 | Tiedje et al. | ................. 136/249 |
| 4,923,524 A | 5/1990 | Kiss | |
| 4,965,225 A | 10/1990 | Yamagishi et al. | ................. 438/795 |
| 5,437,734 A | * 8/1995 | Matsushita et al. | ................. 136/249 |
| 5,527,391 A | 6/1996 | Echizen et al. | ................. 118/719 |

OTHER PUBLICATIONS

"GaAs/Ge Tandem–Cell Space Concentrator Development," Wojtczuk et al. *IEEE Transactions on Electron Devices*. Feb., 1990. No. 2, pp. 455–463.

"High–quality Ge epilayers on Si with low threading–dislocation densities," Luan et al. *Applied Physics Letters*. Nov. 8, 1999.

* cited by examiner

*Primary Examiner*—Alan Diamond
(74) *Attorney, Agent, or Firm*—Gauthier & Connors LLP

(57) ABSTRACT

A multijunction solar cell comprising a silicon solar cell with a germanium solar cell formed on the backside of the silicon solar cell. The silicon solar cell and germanium solar cell are directly coupled via a p-p junction to inactivate interface dislocations. Preferably, the silicon solar cell comprises a p++ type silicon layer; an intrinsic silicon layer formed on the p++ type silicon layer; an n++ type silicon layer formed on the intrinsic type silicon layer; and a p-type silicon layer formed on the n++ type silicon layer. The germanium solar cell preferably comprises an n-type germanium layer; and a p-type germanium layer form on the n-type germanium layer. The p-type germanium layer is coupled to the p++ type silicon layer.

7 Claims, 6 Drawing Sheets

Thickness of 1/e absorption

SILICON SOLAR CELL WITH GERMANIUM BACKSIDE SOLAR CELL

PRIORITY INFORMATION

This application claims priority from provisional application Ser. No. 60/289,410 filed May 8, 2001.

BACKGROUND OF THE INVENTION

The invention relates to the field of solar cells, and in particular to multijunction solar cells.

Photovoltaic cells, commonly known as solar cells, are well known devices that convert light energy into electricity. Solar cells provide a number of advantages when compared to conventional energy sources. For example, solar cells produce electricity without pollution and do not use the dwindling fossil fuel supply.

Silicon is one of the most popular materials for making solar cells. A silicon solar cell is conventionally created by doping the silicon to form an n-type layer and p-type layer. The n and p-type layers form a p-n junction in the silicon. When light illuminates the solar cell, some photons are able to excite electrons from their valence band to the conduction band and to produce electron/hole pairs. The electrons are swept into the n-type layer, while the holes are swept to the p-type layer. Because of the presence of the p-n junction, most of these electron/hole pairs cannot recombine, thereby leaving them to produce an electric current in an external circuit. The photons that can free electrons have a photon energy that is at least equal to and usually higher than the silicon band-gap energy.

One goal in producing solar cells is to increase the charge collection efficiency. However, there are limitations on the charge collection efficiency of conventional silicon solar cells. FIG. 1 illustrates a graph of the typical charge collection efficiency of a conventional silicon solar cell. There are three limitations on the charge collection efficiency, illustrated by dashed lines 100, 102, and 104.

At shorter wavelengths (about 0.5 microns and shorter), light is absorbed in the surface of the silicon, but defects and external impurities in the surface cause easy recombination of holes and electrons. So, as shown by line 100, at shorter wavelengths there is a low charge collection efficiency. From about 0.5 microns to about 0.9 microns, the charge collection efficiency peaks but stays less than one (about 0.7 in this case) due to bulk recombination. This is shown by line 102. Bulk recombination occurs because of defects in the lattice structure make it easier for holes and electrons to recombine. The last limitation, shown by line 104, occurs at wavelengths that have energy slightly above silicon's band gap. These wavelengths, and longer, are weakly absorbed by the silicon. Silicon has a band-gap energy of approximately 1.1 eV but is an indirect semiconductor, so wavelengths between 0.9 to approximately 1.1 microns experience this weak absorption.

One method to increase the efficiency of solar cells is by the use of multifunction cells to absorb wavelengths with energy above silicon's band-gap energy, i.e. increase the absorption of shorter wavelengths. These multifunction cells use solar cells formed on the topside of a silicon solar cell. The solar cell formed on the topside of the silicon solar cell are made of a material that absorbs wavelengths shorter than 0.5 microns. However, this is not an efficient way to increase overall efficiency, since photons with the energy shorter than 0.5 microns are not abundant in the solar spectrum, as explained below.

Another method of increasing the efficiency is to increase the absorption of light at wavelengths with energy near silicon's band-gap. As shown in FIG. 2, this absorption can be improved by increasing the thickness of the silicon. For example, at about 100 microns thick, wavelengths up to about 0.9 microns are absorbed, while at 300 microns thick wavelengths up to about 1 micron are absorbed. Unfortunately, the charge collection efficiency is decreased with increases in thickness. This is because the thickness of the silicon needs to be thinner than the carrier diffusion length L in order for carriers (electrons and holes) to reach electrodes. L is given by:

$$L=(D\tau)^{0.5}$$

where D is the diffusion coefficient and $\tau$ is the recombination lifetime. Thus, to have thicker silicon, the recombination lifetime has to increase to infinite, which is impossible. Accordingly, to increase the efficiency, thickening of solar cells is not realistic. Furthermore, the thickness of the silicon must be decreased if the quality of silicon layers are not high enough. Consequently, there has been a trend towards thinner solar cells to make use of poor quality silicon layers, which is cost-effective. However, thinning of solar cells impedes the absorption of light with energy near the band-gap energy. For example, light with wavelength longer than about 0.7 microns will be wasted when the solar cell becomes 10 micron thick.

Another manner that has been proposed to increase the absorption of longer wavelengths is the use of a multijunction solar with a backside germanium solar cell, as illustrated in FIG. 3. Solar cell 300 comprises a silicon solar cell 302 that has a germanium solar cell 304 formed on its backside. Germanium has a band-gap energy of approximately 0.66 eV and, therefore, can absorb wavelengths with energy near or below silicon's band-gap of 1.1 eV. Thus, as shown in FIG. 4, as light illuminates silicon solar cell 302, wavelengths up to approximately 1 micron are absorbed. Wavelengths greater than 1 micron pass through silicon solar cell 302 into germanium solar cell 304, where wavelengths up to approximately 1.5–1.6 microns are absorbed. A back contact 306b is placed on the germanium solar cell 302 and a front contact 306a is placed on the silicon solar cells. Contacts 306 connect multifunction solar cell 300 to an external load.

Designers of multifunction solar cells, however, have not previously pursued the use of backside germanium solar cells to collect wavelengths with energy near or below silicon's band-gap. This is due to two reasons.

The first reason is that designers have looked at sun power versus wavelength when designing solar cells. As shown in FIG. 5, most of the sun's power is at shorter wavelengths and decreases rapidly as the wavelength increases. This has lead to designs that focus on gathering light at shorter wavelengths, such as the multifunction solar cells formed on the topside of a silicon solar cell described above. However, the photon number is important and the sun power is not, because one photon creates one electron/hole pair and, as can also been seen in FIG. 5, the photon number calculated from sun power decreases more gradually than the sun power as wavelengths increase. Thus, there are still a large number of photons at longer wavelengths even though there is less power. A shorter wavelengths there are not very many photons. Therefore, by using a germanium solar cell, the charge collection efficiency can be increased by absorbing wavelengths with energy near or below silicon's band-gap. An estimate of the efficiency increased by using backside germanium solar cells is illustrated in FIG. 6. The efficiency is increased by approximately 50%, assuming perfect absorption and no recombination. The backside Ge solar cells become more effective when the silicon layer thickness is thinner.

The second reason is the difficulty in growing high quality germanium on silicon because of the lattice constant mismatch around 4%. Thus, it was previously believed that there is no way to grow a high quality crystal on a highly lattice-mismatch substrate. High quality germanium, however, can be grown on silicon by a low temperature buffer layer and cyclic annealing as described in Luan et al., "High-Quality Ge Layers on Si with Low Threading-dislocation Densities," Applied Physics Letters, vol. 75 no. 19, p. 2909, November 1999. The technique as described in Luan et al. provides for high quality germanium to be grown directly on silicon with low threading dislocations.

Even though high quality germanium can be directly grown on silicon with low threading dislocations, there is still a problem with interface dislocations resulting from the lattice constant mismatch between germanium and silicon. These interface dislocations can be detrimental to solar cell characteristics. Some prior designs, such as that described in U.S. Pat. No. 4,492,743, use an intermediate layer of material between the silicon and germanium to combat the interface dislocations. It would, however, be beneficial to have a silicon solar cell with a directly coupled backside germanium solar cell that does not experience these detrimental effects.

SUMMARY OF THE INVENTION

One aspect of the present invention provides a multijunction solar cell comprising a silicon solar cell with a germanium solar cell formed on the backside of the silicon solar cell. The silicon solar cell and germanium solar cell are directly coupled via a p-p junction to inactivate interface dislocations. Preferably, the silicon solar cell comprises a p++ type silicon layer; an intrinsic silicon layer formed on the p++ type silicon layer; an n++ type silicon layer formed on the intrinsic type silicon layer; and a p-type silicon layer formed on the n++ type silicon layer. The germanium solar cell preferably comprises an n-type germanium layer; and a p-type germanium layer form on the n-type germanium layer. The p-type germanium layer is coupled to the p++ type silicon layer.

DETAILED DESCRIPTION OF THE INVENTION

Figure 1:
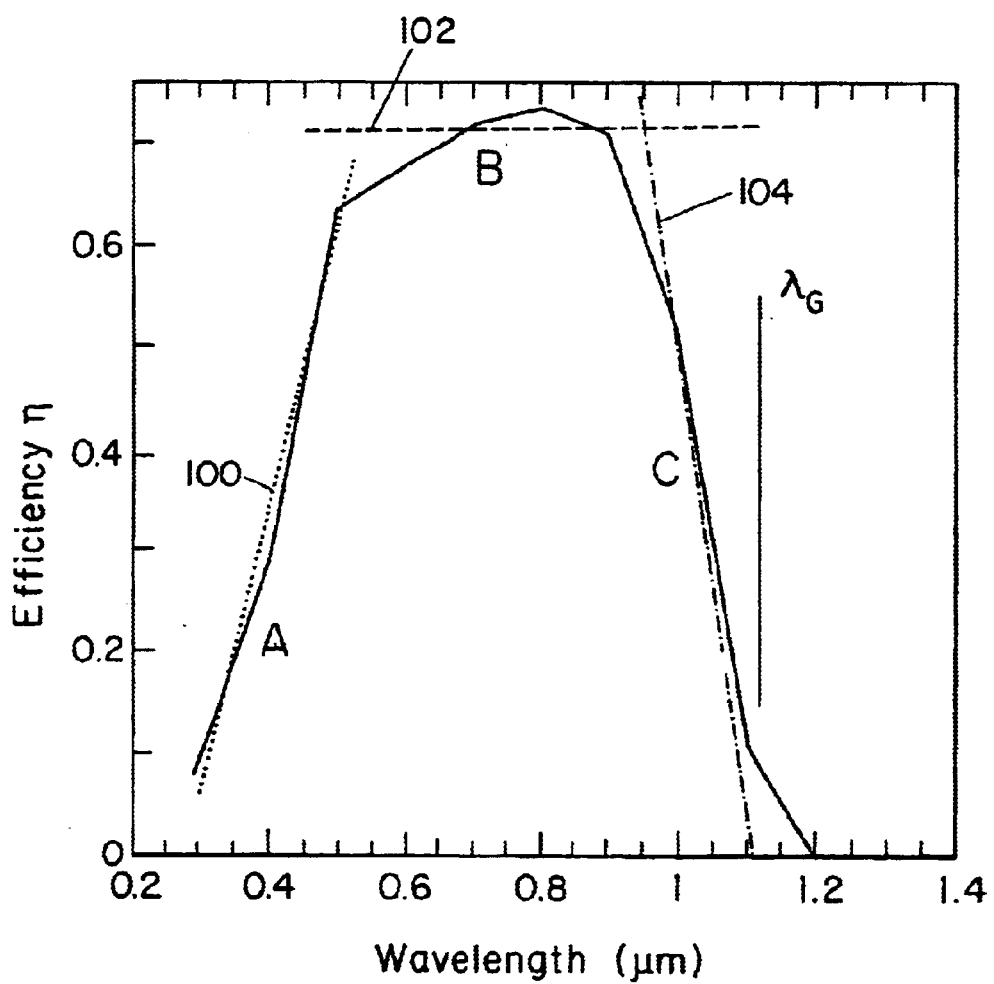
FIG. 1 illustrates a graph of the typical charge collection efficiency of a silicon solar cell.
Figure 2:
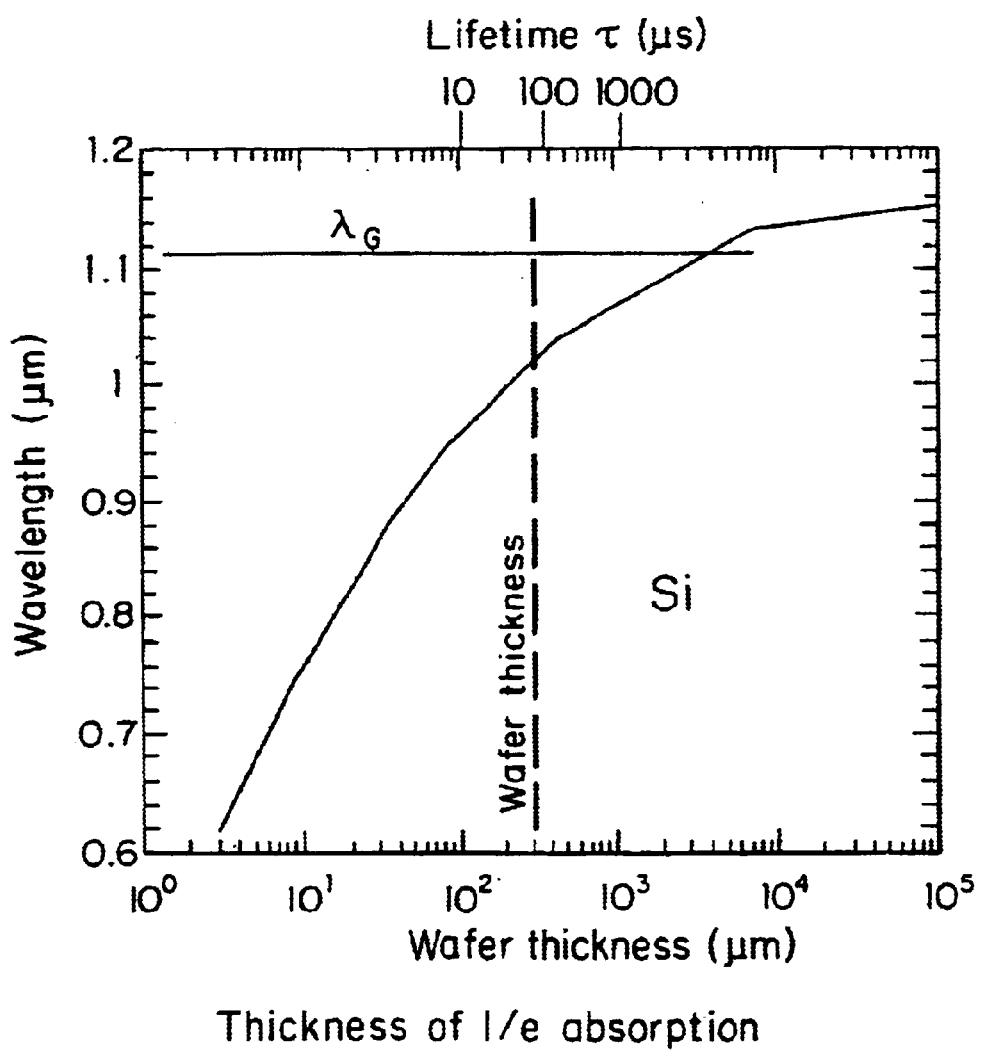
FIG. 2 illustrates a graph of wavelength absorption versus cell thickness.
Figure 3:
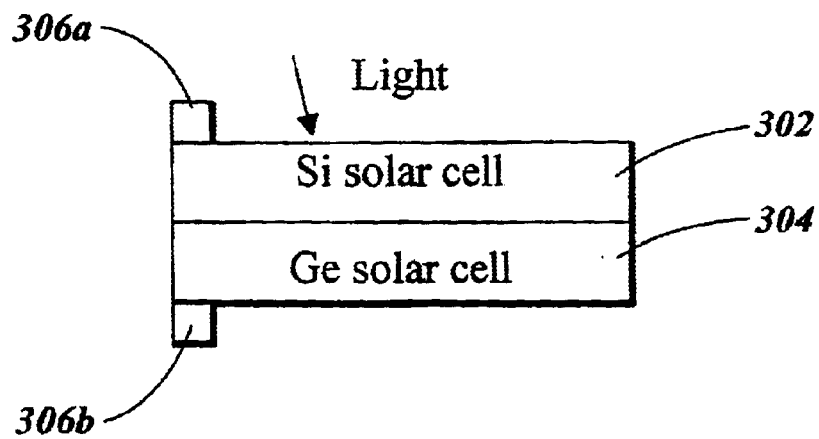
FIG. 3 illustrates a multijunction solar cell with a germanium solar cell on the back of a silicon solar cell.
Figure 4:
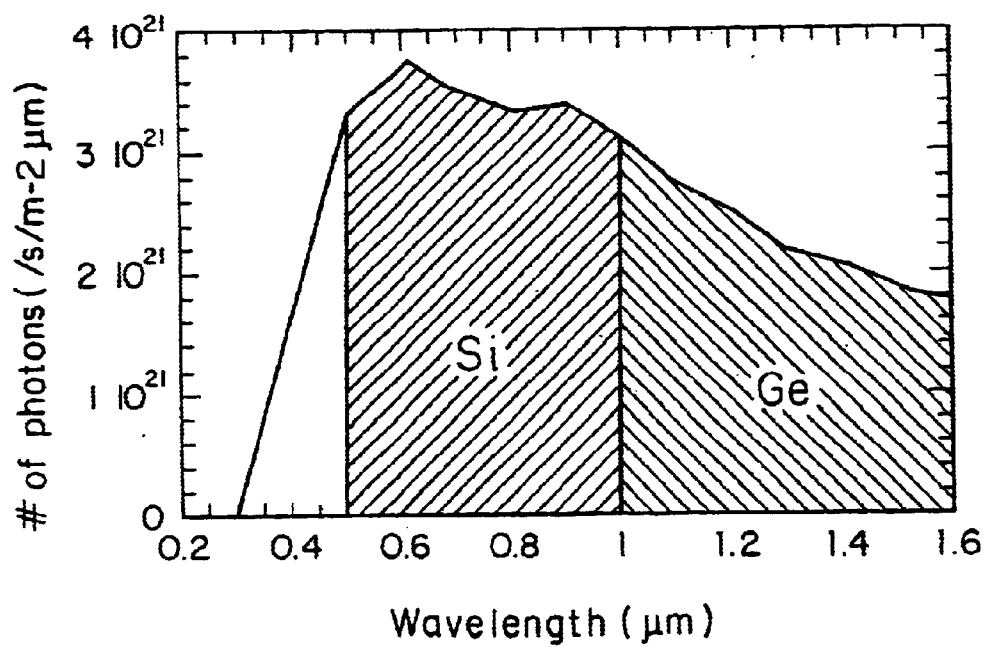
FIG. 4 illustrates the number of photons absorbed versus wavelength for the multijunction solar cell of FIG. 3.
Figure 5:
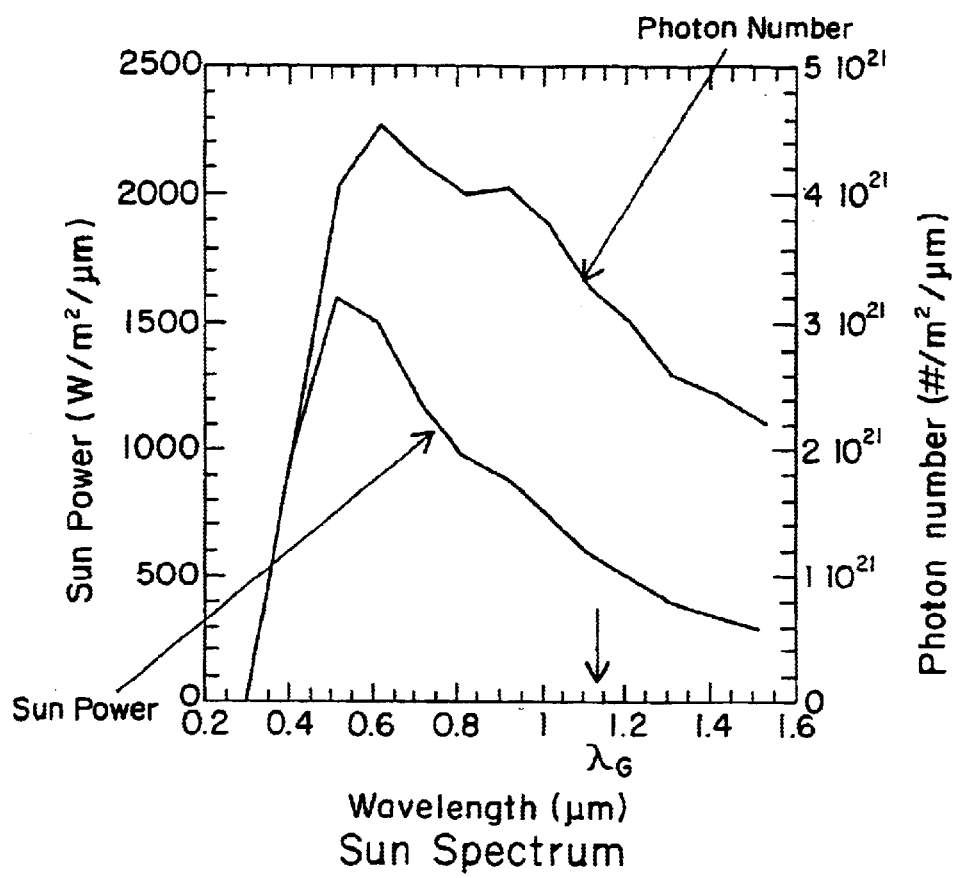
FIG. 5 illustrates photon number and sun power versus wavelength.
Figure 6:
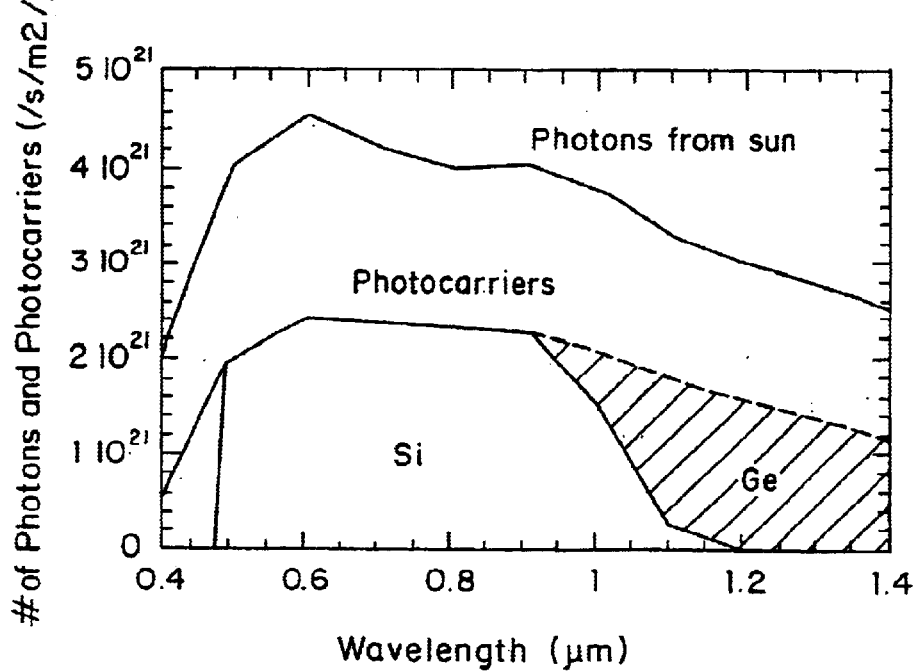
FIG. 6 illustrates an estimate of the efficiency increase by using backside germanium solar cells.
Figure 7:
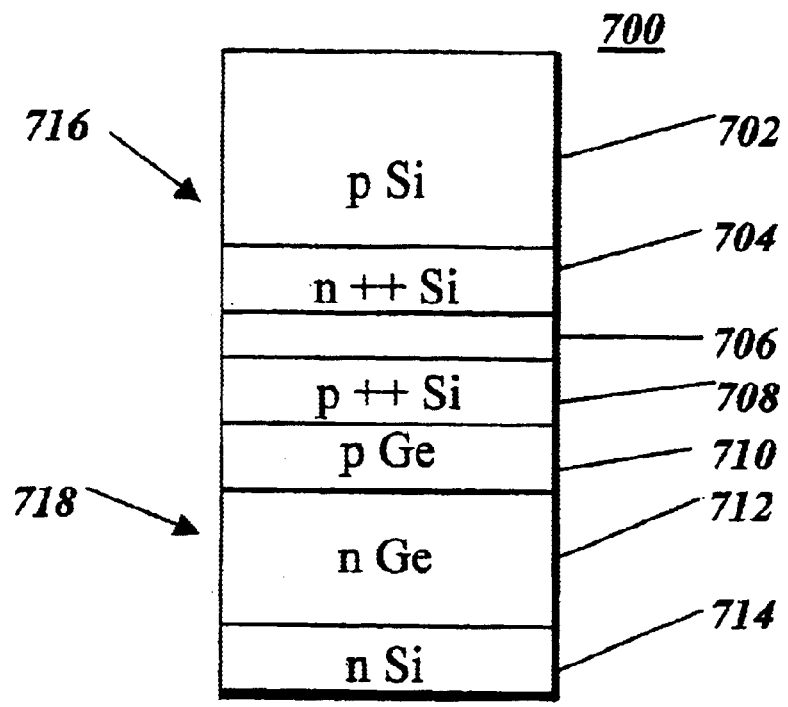
FIG. 7 illustrates multijunction solar cell according to the principles of the present invention.

FIG. 7 illustrates a multijunction solar cell 700 according to the principles of the present invention with a germanium solar cell 718 formed on the backside of a silicon solar cell 716. Silicon solar cell 716 comprises: a p++ type silicon layer 708; an intrinsic layer of silicon 706 formed on the p++ layer; an n++ type silicon layer 704 formed on the intrinsic layer; and a p-type silicon layer 702 formed on the n++ layer. The junction between the p layer 702 and n++ layer 704 is the photoactive junction, while the n++ layer 704, intrinsic layer 706, and p++ layer 708 act as a tunnel diode that aids in the flow of electrons from silicon cell 716 to germanium cell 718. Germanium solar cell 718 comprises an n-type layer 712 of germanium with a p-type layer 710 of germanium formed on it. The p++ layer 708 of the silicon is formed on p layer 710 of germanium. To get current matching between the Si solar cell and the germanium backside solar cell, the Si layer thickness should be optimized. The germanium layers are preferably grown on the silicon using the process as described in Luan et al.

The p-p junction between the silicon cell 716 and germanium cell 718 inactivates the detrimental effects of the interface dislocations. As described above, because of lattice constant differences between silicon and germanium, any interface between the two experiences dislocations. These interface dislocations are detrimental to device characteristics when they occur in the tunnel diode region. By forming a tunnel diode using the additional intrinsic layer 706 and p++ layer 708, interface dislocations are not formed in the tunnel diode region.

Because germanium does not form a good passivation layer ($GeO_2$ is very volatile and easily eroded in air), the germanium solar cell 718 is preferably passivated by a layer of n-type silicon 714. $SiO_2$ is formed on the n-type silicon layer 714 as a passivation layer after the back contacts (not shown) have been formed on the n-type silicon layer 714. Front contacts (not shown) are formed on the p-type silicon layer 702.

Figure 8:
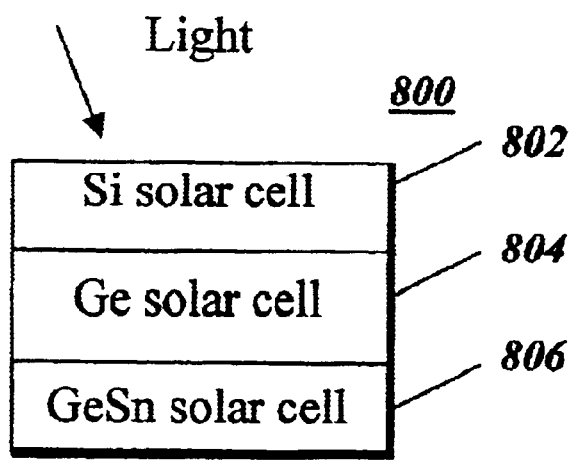
FIG. 8 illustrates another multifunction solar cell according to the principles of the present invention.

FIG. 8 illustrates another multifunction solar cell according to the principles of the present invention. In addition to a germanium solar cell 804 formed on the backside of a silicon solar cell 802, a germanium-tin solar cell 806 is formed on the backside of germanium solar cell 804. The germanium-tin solar cell absorbs wavelengths with energy near or below germanium's band-gap.

Figure 9:
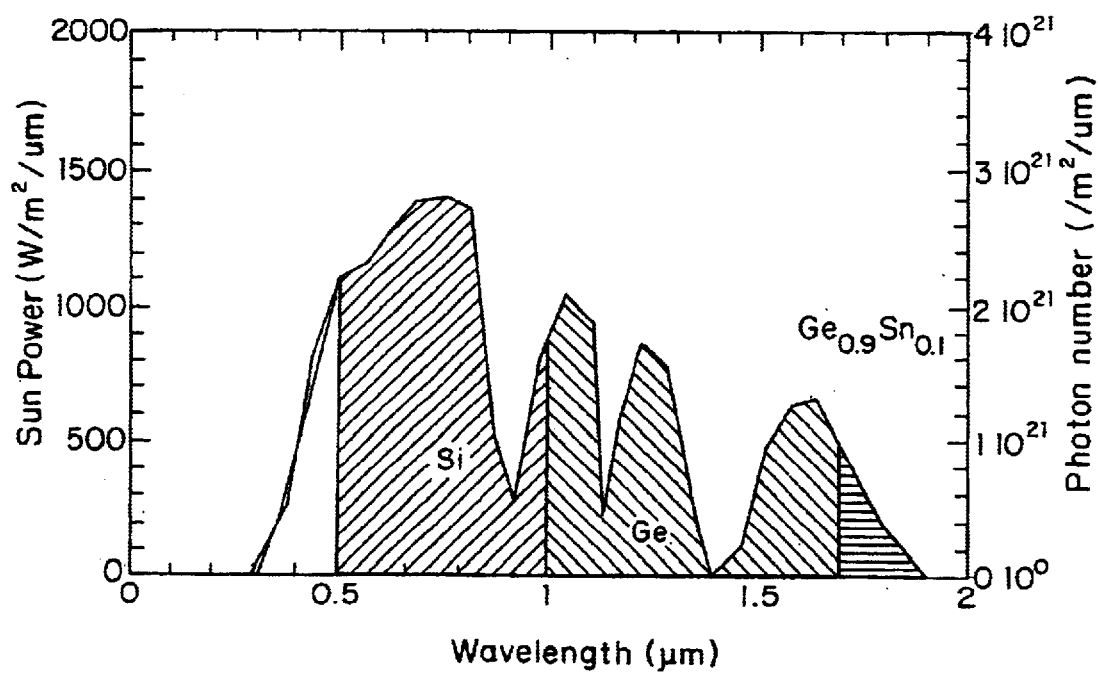
FIG. 9 illustrates the additional absorption of wavelengths using a solar cell as illustrated in FIG. 8.

FIG. 9 illustrates the additional absorption of wavelengths using a solar cell as illustrated in FIG. 8 in which the backside germanium-tin solar cell 806 is formed from $Ge_{0.9}Sn_{0.1}$. As shown, the silicon solar cell 802 absorbs wavelengths up to approximately 1 micron. The germanium solar cell 804 then absorbs wavelengths up to approximately 1.6 microns. Lastly, the germanium-tin solar cell 806 absorbs wavelengths up to approximately 1.9 microns.

Although the present invention has been shown and described with respect to several preferred embodiments thereof, various changes, omissions and additions to the form and detail thereof, may be made therein, without departing from the spirit and scope of the invention.

What is claimed is:

1. A multijunction solar cell comprising:
   a silicon solar cell comprising:
      a p++ type silicon layer;
      an intrinsic silicon layer formed on the p++ type silicon layer;
      an n++ type silicon layer formed on the intrinsic type silicon layer; and
      a p-type silicon layer formed on the n++ type silicon layer;
   a germanium solar cell comprising:

an n-type germanium layer; and a p-type germanium layer form on the n-type germanium layer; and wherein the p-type germanium layer is coupled to the p++ type silicon layer to inactivate interface dislocations.

2. A multijunction solar cell comprising:

a silicon solar cell comprising a non-light receiving end comprising a p++ type silicon layer, an intrinsic silicon layer formed on the p++ type silicon layer, an n++ type silicon layer formed on the intrinsic type silicon layer, and a p-type silicon layer formed on the n++ type silicon layer; and a germanium solar cell having a light receiving end comprising a p-type germanium layer;

wherein the non-light receiving end comprising a p++ type silicon layer is directly coupled to the light receiving end comprising a p-type germanium layer.

3. The multijunction solar cell as per claim 2, wherein the germanium solar cell further comprises:

an n-type germanium layer; and a p-type germanium layer formed on the n-type germanium layer.

4. The solar cell as per claim 3, wherein a surface of the n-type germanium layer is passivated by an n-type silicon layer.

5. The solar cell as per claim 2, further comprising:

a germanium-tin solar cell formed on the non light receiving end of the germanium solar cell.

6. A method of forming a multijunction solar cell, the method comprising:

forming a silicon solar cell comprising:

a p++ type silicon layer;

an intrinsic silicon layer formed on the p++ type silicon layer;

an n++ type silicon layer formed on the intrinsic type silicon layer;

a p-type silicon layer formed on the n++ type silicon layer;

forming a germanium solar cell comprising:

an n-type germanium layer;

a p-type germanium layer form on the n-type germanium layer; and wherein the p-type germanium layer is coupled to the p++ type silicon layer.

7. The method as per claim 6 further comprising:

forming a germanium-tin solar cell having a light receiving end coupled to the n-type layer of the germanium solar cell.

* * * * *